(12) United States Patent
Wu

(10) Patent No.: US 7,120,844 B2
(45) Date of Patent: Oct. 10, 2006

(54) SYSTEM AND METHOD FOR PERFORMING SCAN TEST WITH SINGLE SCAN CLOCK

(75) Inventor: Chi-Feng Wu, Kao-Hsiung (TW)

(73) Assignee: Realtek Semiconductor Corp., HsinChu (TW)

( * ) Notice: Subject to any disclaimer, the term of this patent is extended or adjusted under 35 U.S.C. 154(b) by 430 days.

(21) Appl. No.: 10/605,031

(22) Filed: Sep. 3, 2003

(65) Prior Publication Data

US 2005/0022083 A1 Jan. 27, 2005

(30) Foreign Application Priority Data

Jul. 2, 2003 (TW) ............................... 92118131 A

(51) Int. Cl.
*G01R 31/28* (2006.01)
*G06F 11/00* (2006.01)

(52) U.S. Cl. ..................................... 714/731; 714/729
(58) Field of Classification Search ..................... None
See application file for complete search history.

(56) References Cited

U.S. PATENT DOCUMENTS

| | | | |
|---|---|---|---|
| 6,321,355 B1 * | 11/2001 | Izaki et al. .................. 714/727 |
| 6,393,592 B1 * | 5/2002 | Peeters et al. .............. 714/731 |
| 6,442,722 B1 * | 8/2002 | Nadeau-Dostie et al. ... 714/731 |
| 6,598,192 B1 * | 7/2003 | McLaurin et al. .......... 714/726 |

\* cited by examiner

*Primary Examiner*—Christine T. Tu
(74) *Attorney, Agent, or Firm*—Winston Hsu

(57) ABSTRACT

A logic system for performing scan test with single scan clock and related method. The logic system includes a first clock domain, which performs logic operations and scan tests with a first clock signal, and a second clock domain, which performs logic operations with a second clock signal and performs scan tests with the first clock signal.

13 Claims, 9 Drawing Sheets

SYSTEM AND METHOD FOR PERFORMING SCAN TEST WITH SINGLE SCAN CLOCK

BACKGROUND OF INVENTION

1. Field of the Invention

The present invention relates to a multiple clock domain logic system, and more particularly, to a system and method for performing scan tests with a single scan clock.

2. Description of the Prior Art

Digital logic circuits are commonly applied in many electronic devices. A digital logic circuit includes combinational circuits and sequential circuits. The combinational circuits generate output signals according to current input signals. The sequential circuits, which have memory functionality, can generate output signals according to previous input signals along the time axis.

Devices for circuit debugging and testing are usually required when designing and producing a digital logic circuit. Circuit testing devices in the art include a plurality of flip flop scan cells (as shown in FIG. 1) linked together to form a scan chain (such as the scan chain 200 shown in FIG. 2). Loading predetermined logic values into a scan chain to debug a digital logic circuit is known as a scan test.

Please refer to FIG. 1 showing a block diagram of a D-type flip flop scan cell 100 in the prior art. The D-type flip flop scan cell 100 comprises a D-type flip flop 102 and a multiplexer 104 for selectively outputting a function input signal D or a scan input signal SI according to a scan enable signal SE. When the scan enable signal SE is in a scan enable state, the multiplexer output end 138 sends the scan input signal SI to the D-type flip flop 102. When the scan enable signal SE is in a scan disable state, the multiplexer output end 138 sends the function input signal D to the D-type flip flop 102. The D-type flip flop 102 outputs a corresponding output signal through an output end 116 according to the inputted signal received from the multiplexer 104 or outputs a corresponding complementary output signal through a complementary output end 118 according to the inputted signal received from the multiplexer 104.

Please refer to FIG. 2 showing a scan chain 200 in the prior art. A plurality of D-type flip flop scan cells 210, 230 is linked together to form a scan chain 200. A scan input end 234 of the next D-type flip flop scan cell 230 is electrically connected with a data output end 220 of the previous D-type flip flop scan cell 210 to form the scan chain 200. When the scan enable signal is in a scan enable state, the scan input signal is inputted into the scan chain 200 sequentially according to a clock signal Clk. The goal in providing the sequential circuits, such as the D-type flip flop scan cells 210, 230, with predetermined logic values respectively to debug the logic system is accomplished.

Some logic systems need at least two clock signals for synchronization. The combination of devices operating according to the same clock signal is defined as a clock domain. Accordingly, a logic system of this kind includes at least two clock domains. The devices of each clock domain operate according to the clock signal of a specific frequency corresponding to the clock domain.

A multiple clock domain logic system 500 is shown in FIG. 3. The D-type flip flop scan cells 512, 514, 516, 522, 524, 532 of the logic system 500 rely on the clock signals of different frequencies as the base for synchronization so that the scan cells 512, 514, 516, 522, 524, 532 belong to the different clock domains 510, 520, 530. Hence when the multiple clock domain logic system 500 of the prior art is performing a scan test, the clock domains 510, 520, 530 receive the scan input signals scan_in_1, scan_in_2, scan_in_3 respectively to perform the scan test and output the scan output signals scan_out_1, scan_out_2, scan_out_3 respectively. Please refer to FIG. 4. Corresponding to the number of the scan input signals scan_in_1, scan_in_2, scan_in_3 and the scan output signals scan_out_1, scan_out_2, scan_out_3, a scan test equipment should include enough number of input ports and output ports for performing the scan test. However, the price of the scan test equipment corresponds to the amount of scan input signals scan_in_1, scan_in_2, scan_in_3 and scan output signals scan_out_1, scan_out_2, scan_out_3. Furthermore, while loading a shorter scan chain with one of the scan signals is completed during a scan test, only a part of loading a longer scan chain with one of the scan signals is completed so that the input ports and the output ports corresponding to the shorter scan chain are idling and waiting for the full completion of loading the longer scan chain. As a result, the scan test equipment is not fully utilized while shortening the time for the scan test is impossible.

Known in the art, a conventional apparatus for linking the scan chains of different clock domains with latches is shown in FIG. 5. The elements of FIG. 5 correspond to the elements of FIG. 3 while the scan chains of different clock domains are linked with D latches 702, 704. However, all clock signals clk1, clk2, clk3 should be provided for performing the scan test of the multiple clock domain logic system 700, and the arrangement of the scan chains in FIG. 5 should be first linking the D-type flip flop scan cells of the same clock domain and second linking the clock domains according to the order of the frequencies of the clock signals of the clock domains; rather than first adjusting the amount of the scan chains according to the amount of input ports and output ports and second equalizing the lengths of the scan chains to load the scan chains in parallel to solve the problem of the idling status of the input ports and the output ports. As a result, the known in the art apparatus of linking the scan chains of different clock domains with latches is not a solution of the above-mentioned problem.

SUMMARY OF INVENTION

It is therefore a primary objective of the claimed invention to provide a system and method for performing scan tests with a single scan clock to solve the above-mentioned problem.

The present invention provides a logic system for performing scan tests with a single scan clock and a related method. The system includes a first clock domain for performing logic operations and scan tests with a first clock signal. The first clock domain includes a first clock input for inputting the first clock signal. Further included is a multiplexer for selectively outputting the first clock signal or a second clock signal according to a mode signal. The system further includes a second clock domain for performing logic operations with the second clock signal and for performing scan tests withthe first clock signal.

These and other objectives of the present invention will no doubt become obvious to those of ordinary skill in the art after reading the following detailed description of the preferred embodiment that is illustrated in the various figures and drawings.

DETAILED DESCRIPTION

When the multiple clock domain logic system according to the present invention performs logic operations, each clock domain performs logic operations according to the corresponding clock signal. When the system performs scan tests, all clock domains are linked together to perform scan tests according to the same clock signal.

Figure 1:
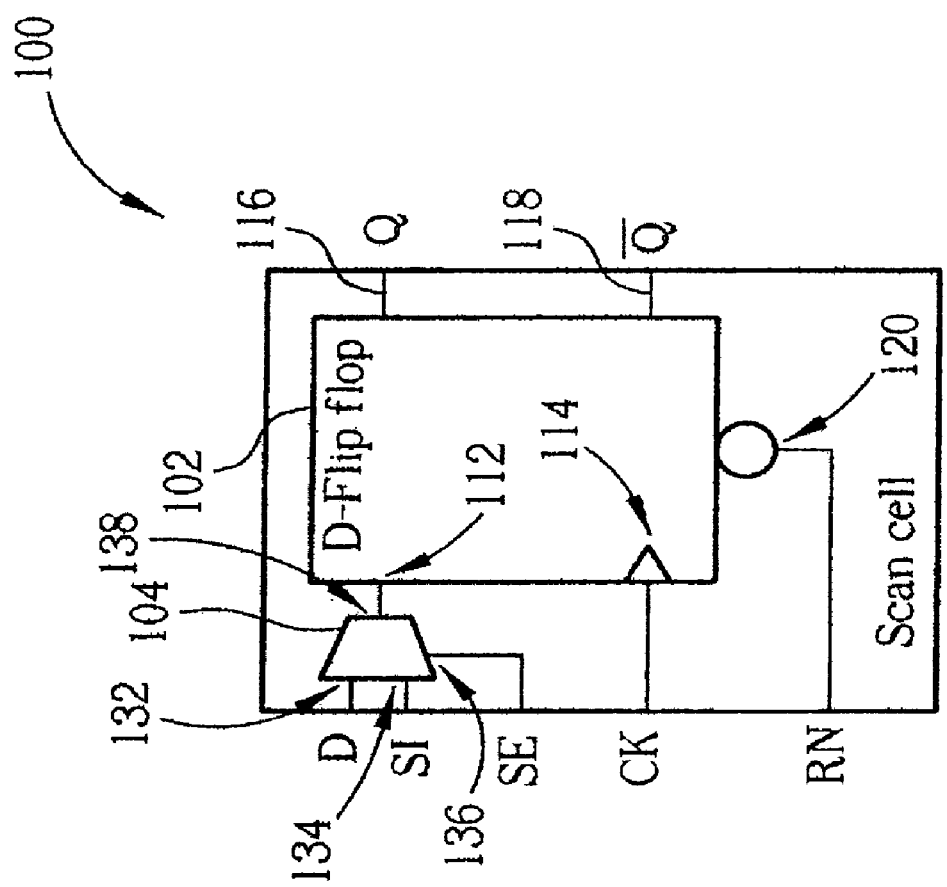
FIG. 1 is a block diagram of a D-type flip flop scan cell according to the prior art.
Figure 2:
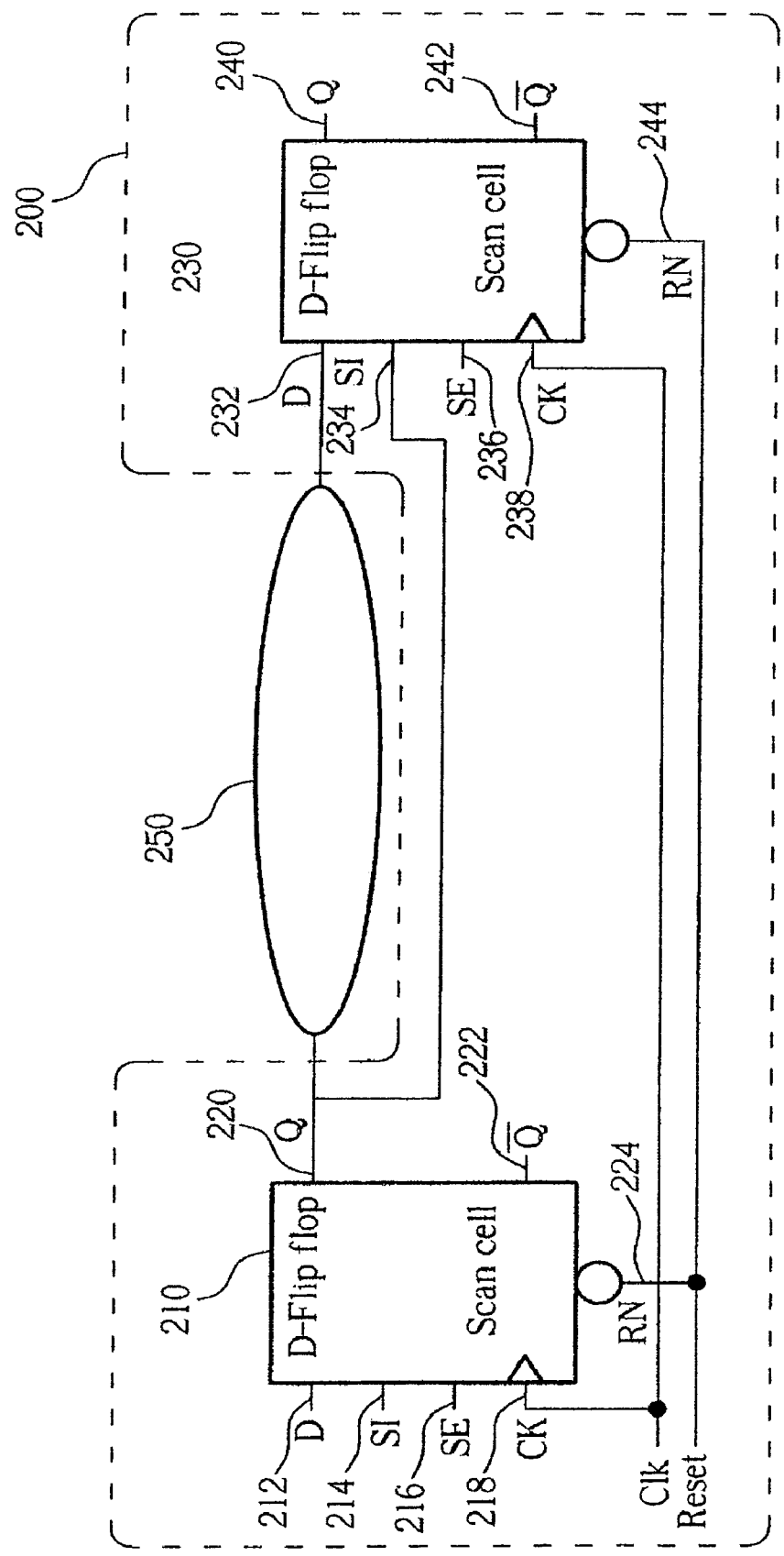
FIG. 2 is a block diagram of a scan chain according to the prior art.
Figure 3:
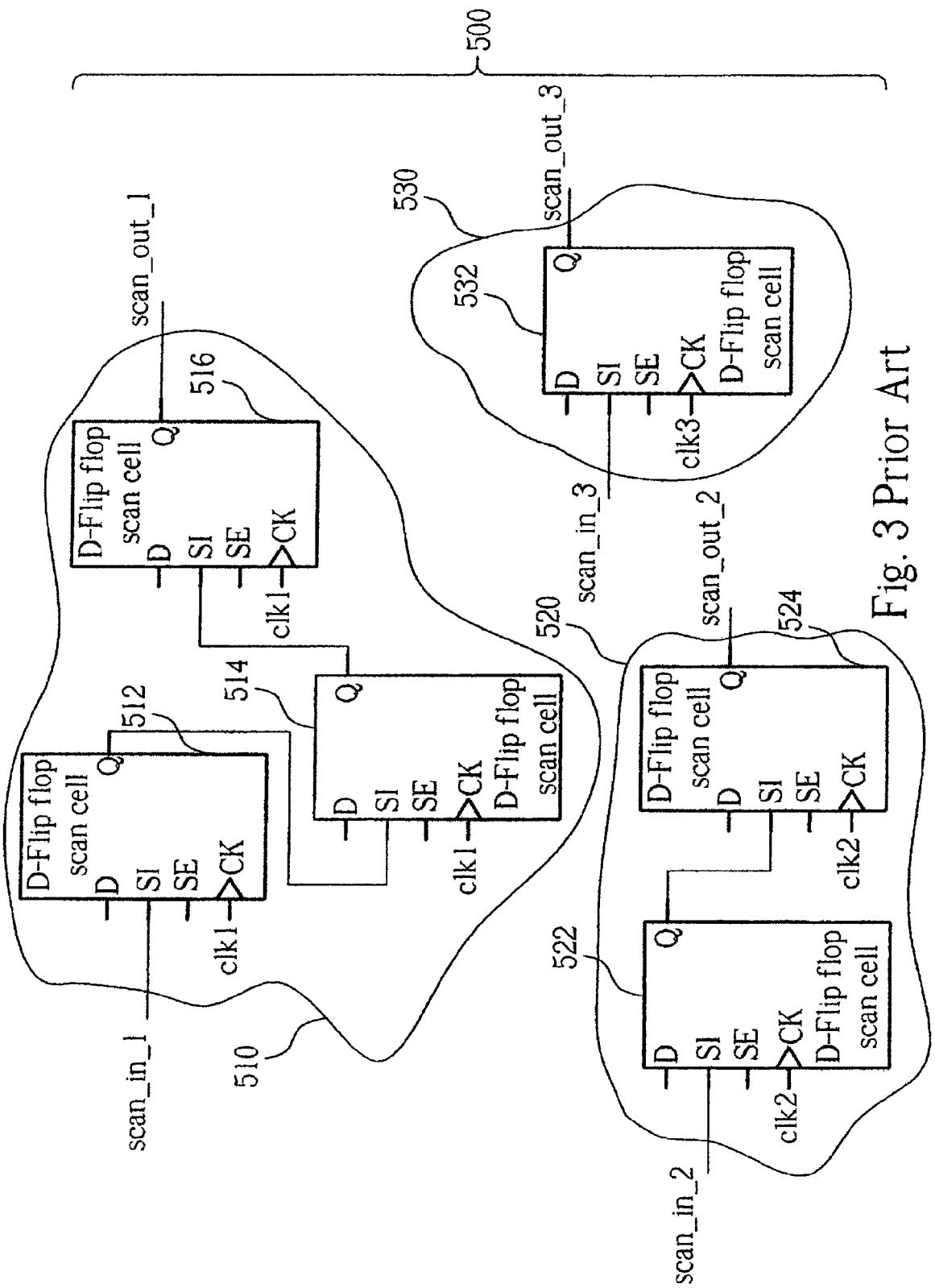
FIG. 3 is a block diagram of a multiple clock domain logic system according to the prior art.
Figure 4:
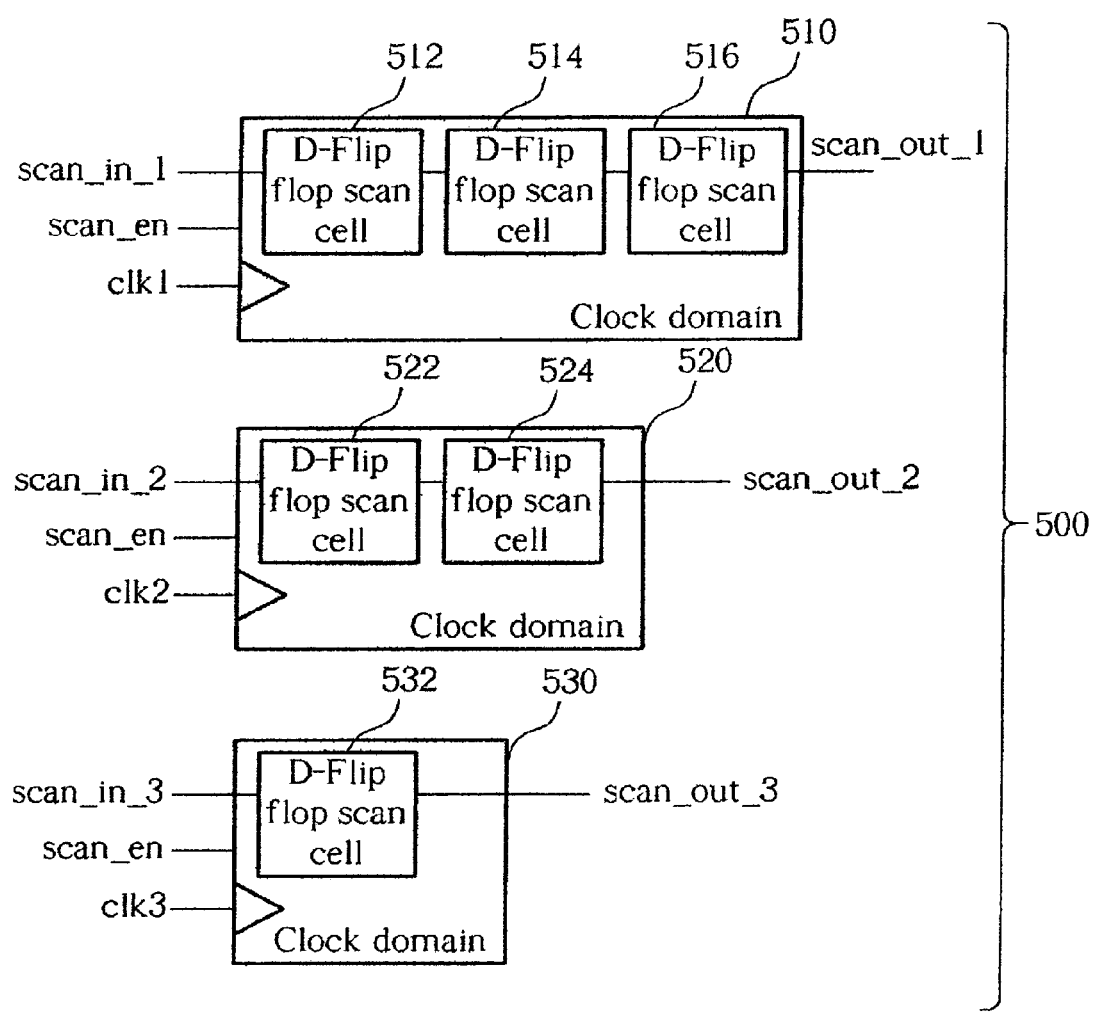
FIG. 4 is a scan chain diagram of the multiple clock domain logic system of FIG. 3.
Figure 5:
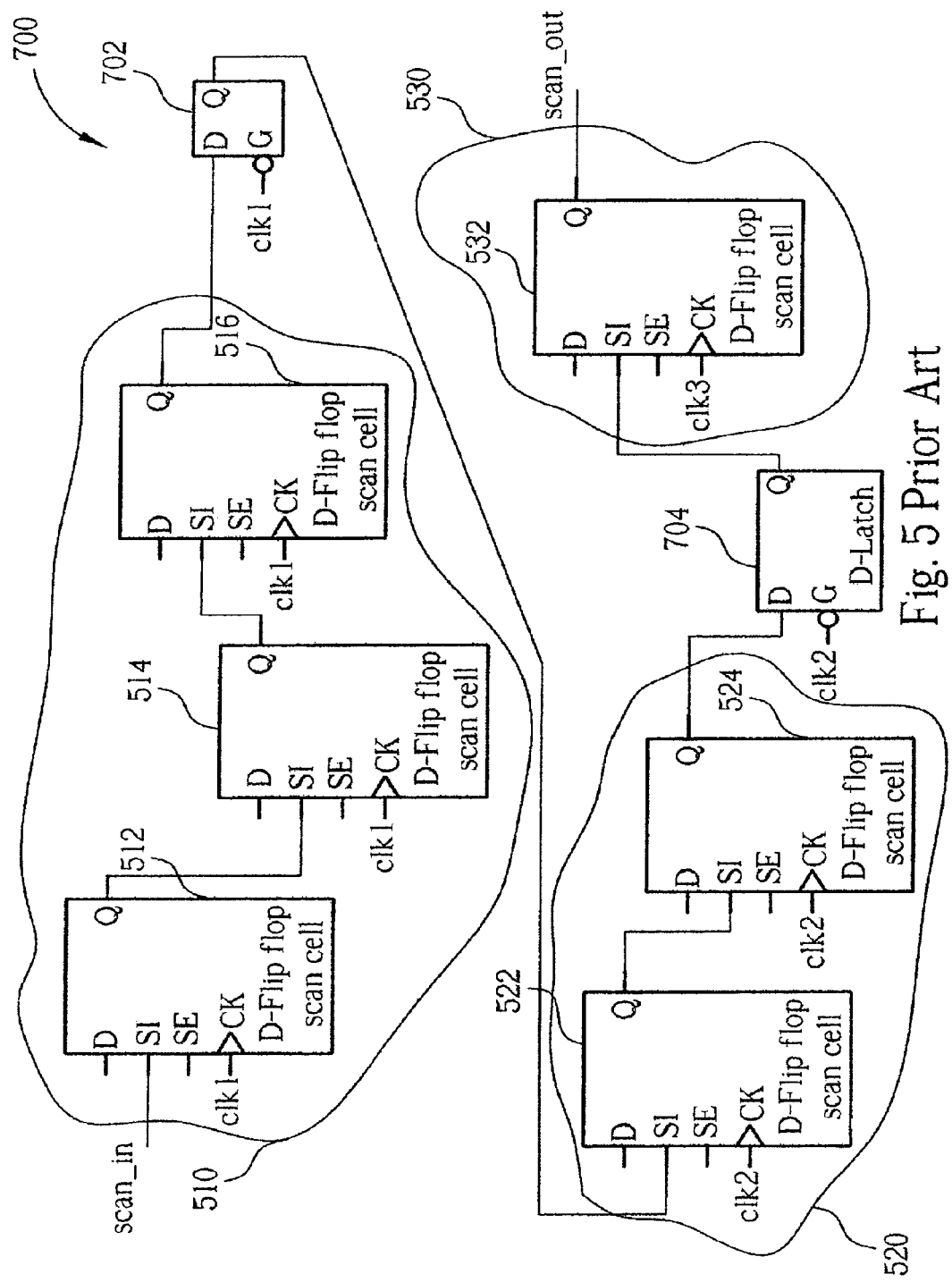
FIG. 5 is a block diagram of a multiple clock domain logic system according to the prior art.
Figure 6:
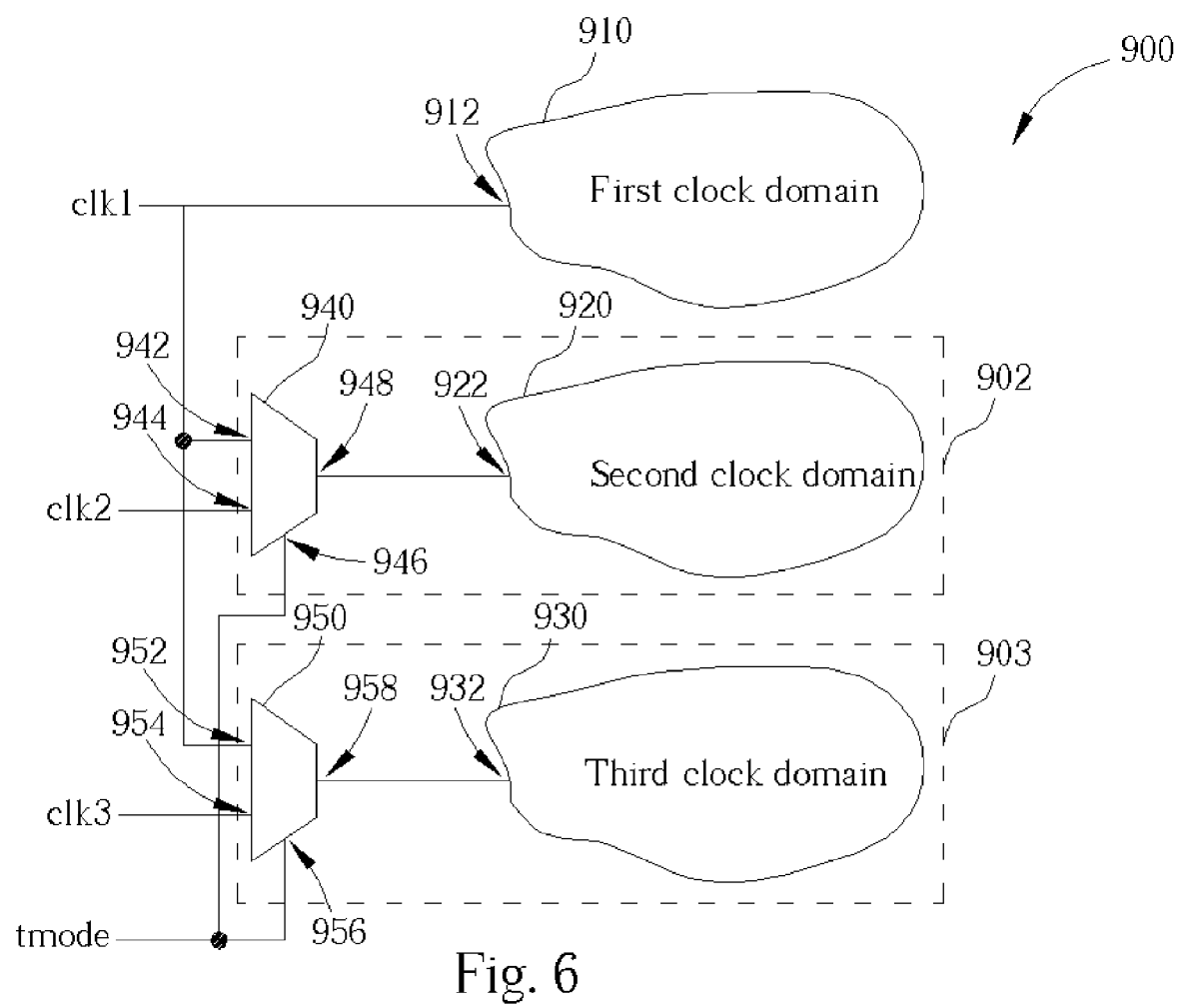
FIG. 6 is a block diagram of the multiple clock domain logic system according to the first embodiment of the present invention.

FIG. 6 is a block diagram of a multiple clock domain logic system 900 for performing scan tests with a single scan clock according to the present invention. FIG. 6 illustrates a multiple clock domain logic system 900 for performing logic operations with a first clock signal clk1, a second clock signal clk2, and a third clock signal clk3 and for performing scan tests with the first clock signal clk1. The logic system 900 comprises a first clock domain 910 for performing logic operations and scan tests with the first clock signal clk1. The first clock domain 910 comprises a first clock input end 912 for inputting the first clock signal clk1. The logic system 900 further comprises a second clock domain composite module 902 comprising a second multiplexer 940 for selectively outputting the first clock signal clk1 or the second clock signal clk2 as a second clock domain driving signal. The second clock domain composite module 902 further comprises a second clock domain 920 for performing logic operations with the second clock signal clk2 and for performing scan tests with the first clock signal clk1. The second clock domain 920 comprises a second clock input end 922 electrically connected to an output end 948 of the second multiplexer 940 for inputting the first clock signal clk1 or the second clock signal clk2. In this embodiment, the logic system 900 further comprises a third clock domain composite module 903 which is similar to the second clock domain composite module 902 so further details in structure are therefore not repeated. The third clock domain 930 performs logic operations with the third clock signal clk3 and performs scan tests with the first clock signal clk1.

Figure 7:
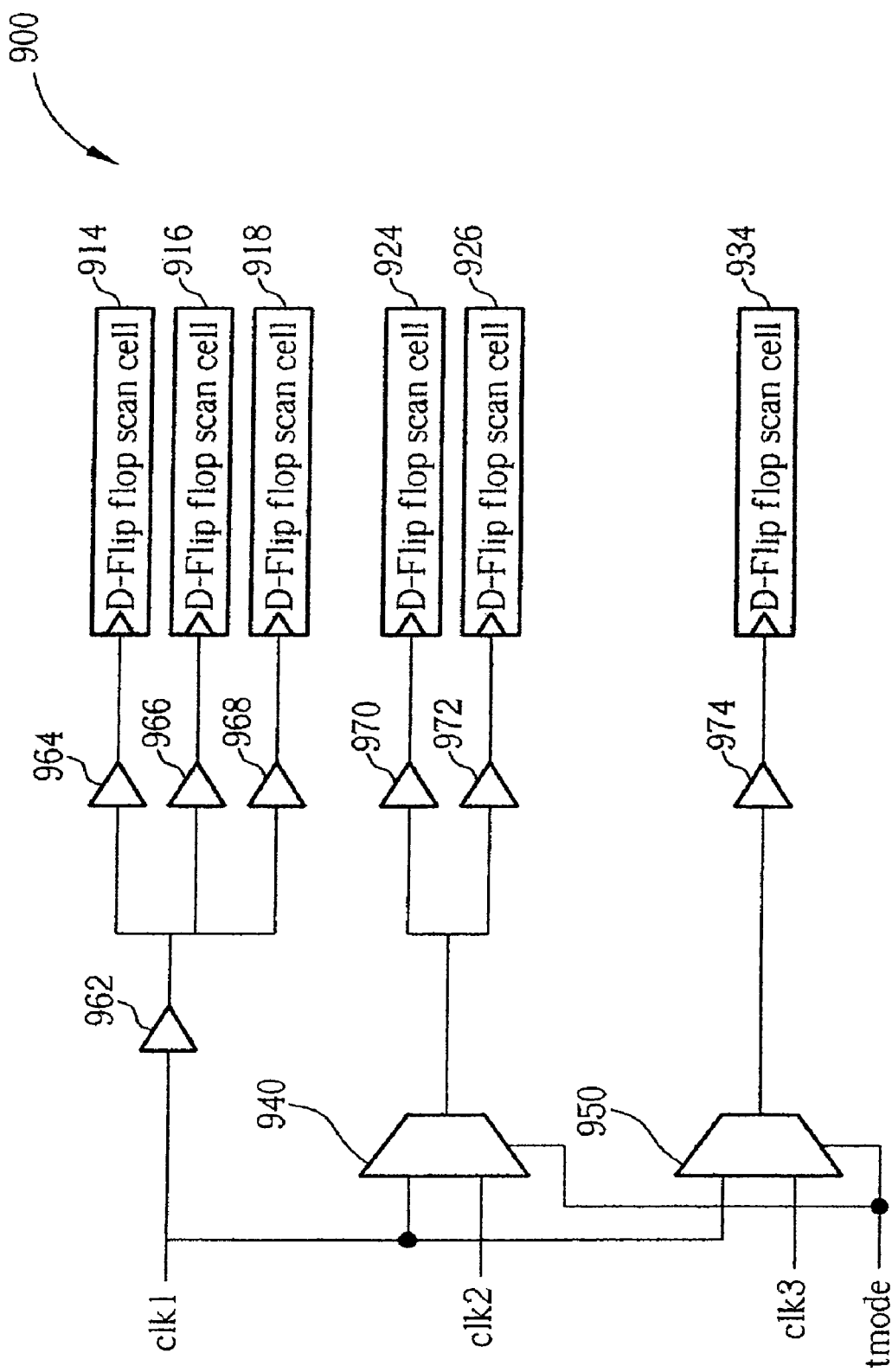
FIG. 7 is a clock tree diagram of the multiple clock domain logic system of FIG. 6.

Please refer to FIG. 7 showing a clock tree diagram of the multiple clock domain logic system 900 in FIG. 6. The first clock domain 910 comprises a plurality of D-type flip flop scan cells 914, 916, 918 for performing logic operations and scan tests according to the first clock signal clk1. Each D-type flip flop scan cells 914, 916, 918 comprises a scan cell clock input end for inputting the first clock signal clk1. When logic operations are performed, the second multiplexer 940 selectively output the second clock signal clk2 to the second clock domain 920 according to a mode signal tmode, and the third multiplexer 950 selectively output the third clock signal clk3 to the third clock domain 930 according to the mode signal tmode. Therefore, D-type flip flop scan cells 924, 926 of the second clock domain 920 and a D-type flip flop scan cell 934 of the third clock domain 930 perform logic operations respectively according to the second clock signal clk2 and the third clock signal clk3. When scan tests are performed, the second multiplexer 940 and the third multiplexer 950 selectively output the first clock signal clk1 to the second clock domain 920 and the third clock domain 930 according to the mode signal tmode. As a result, all of the D-type flip flop scan cells 924, 926 of the second clock domain 920 and the D-type flip flop scan cell 934 of the third clock domain 930 perform scan tests according to the first clock signal clk1.

The characteristic that clock signals arriving at corresponding D-type flip flop scan cells at the same time is so-called clock tree balance characteristic. Further, the characteristic that clock signals arriving at corresponding D-type flip flop scan cells at almost the same time is called clock tree quasi-balance characteristic. Please refer to FIG. 7. In this embodiment, buffers 962, 964, 966, 968, 970, 972, 974 are installed to make the system 900 have the clock tree balance characteristic or the clock tree quasi-balance characteristic with respect to the first clock signal clk1 so that a clock skew phenomenonof the system 900 is avoided. That is, the asynchrony phenomenon—that clock signals cannot reach corresponding elements at the same time is avoided.

Figure 8:
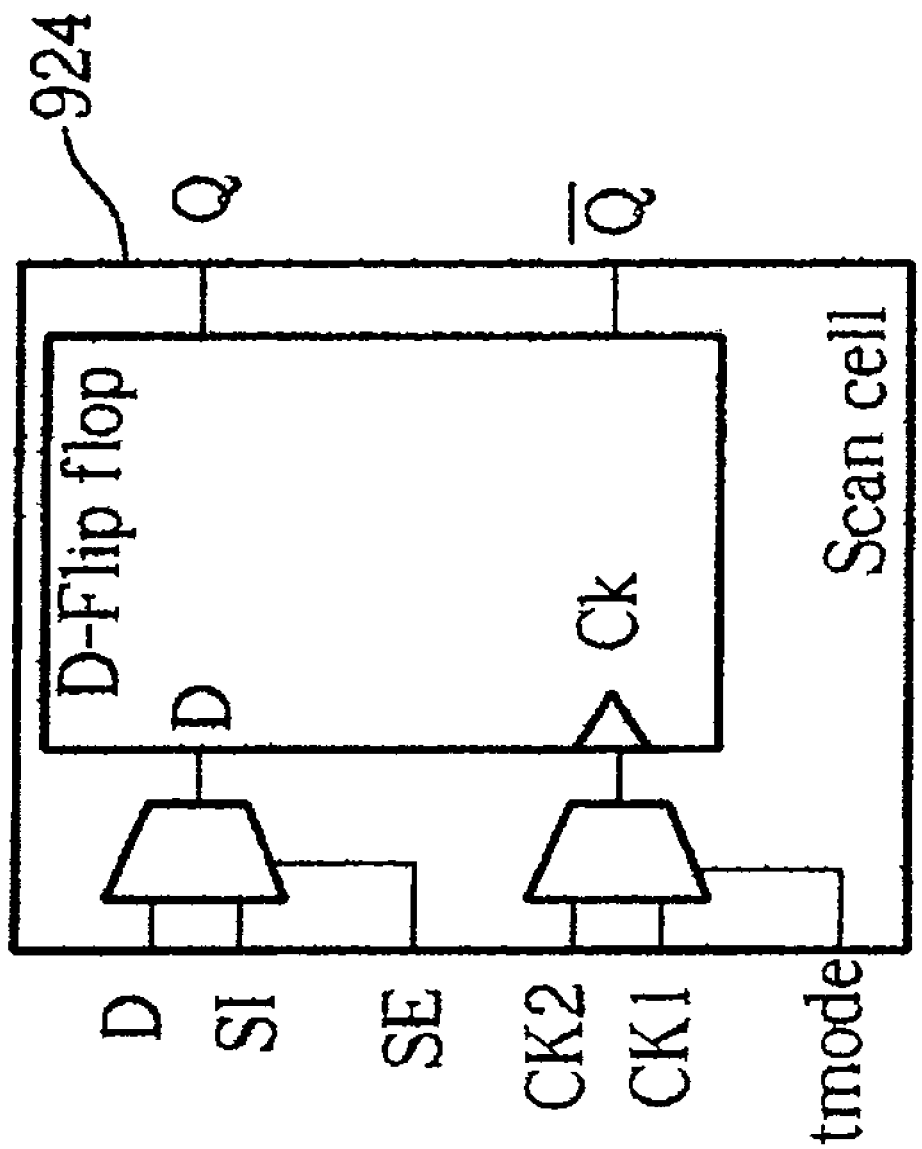
FIG. 8 is a block diagram of a D-type flip flop scan cell according to the second embodiment of the present invention.

Please refer to FIG. 8 showing a block diagram of a D-type flip flop scan cell according to the second embodiment of the present invention. The difference between the second embodiment and the first embodiment is that a clock signal multiplexer is installed in each D-type flip flop scan cell of the second embodiment for selectively inputting a clock signal into the scan cell. For example, the D-type flip flop scan cell 924 of the second clock domain comprises a clock signal multiplexer for selectively outputting the first clock signal clk1 or the second clock signal clk2 to the D-type flip flop installed in the scan cell 924 according to the mode signal tmode. When performing logic operations, the scan enable signal SE selects the function input signal D and the mode signal tmode selects the second clock signal clk2 (CK2 of FIG. 8) for the D-type flip flop installed in the scan cell 924. When performing scan tests, the scan enable signal SE selects the scan input signal SI and the mode signal tmode selects the first clock signal clk1 (CK1 of FIG. 8) for the D-type flip flop installed in the scan cell 924. Therefore, the second embodiment fulfills the goal of the present invention by providing the apparatus of the D-type flip flop scan cell shown in FIG. 8 rather than installing the multiplexers 940, 950 for the corresponding clock domains 920, 930 illustrated in the first embodiment.

Figure 9:
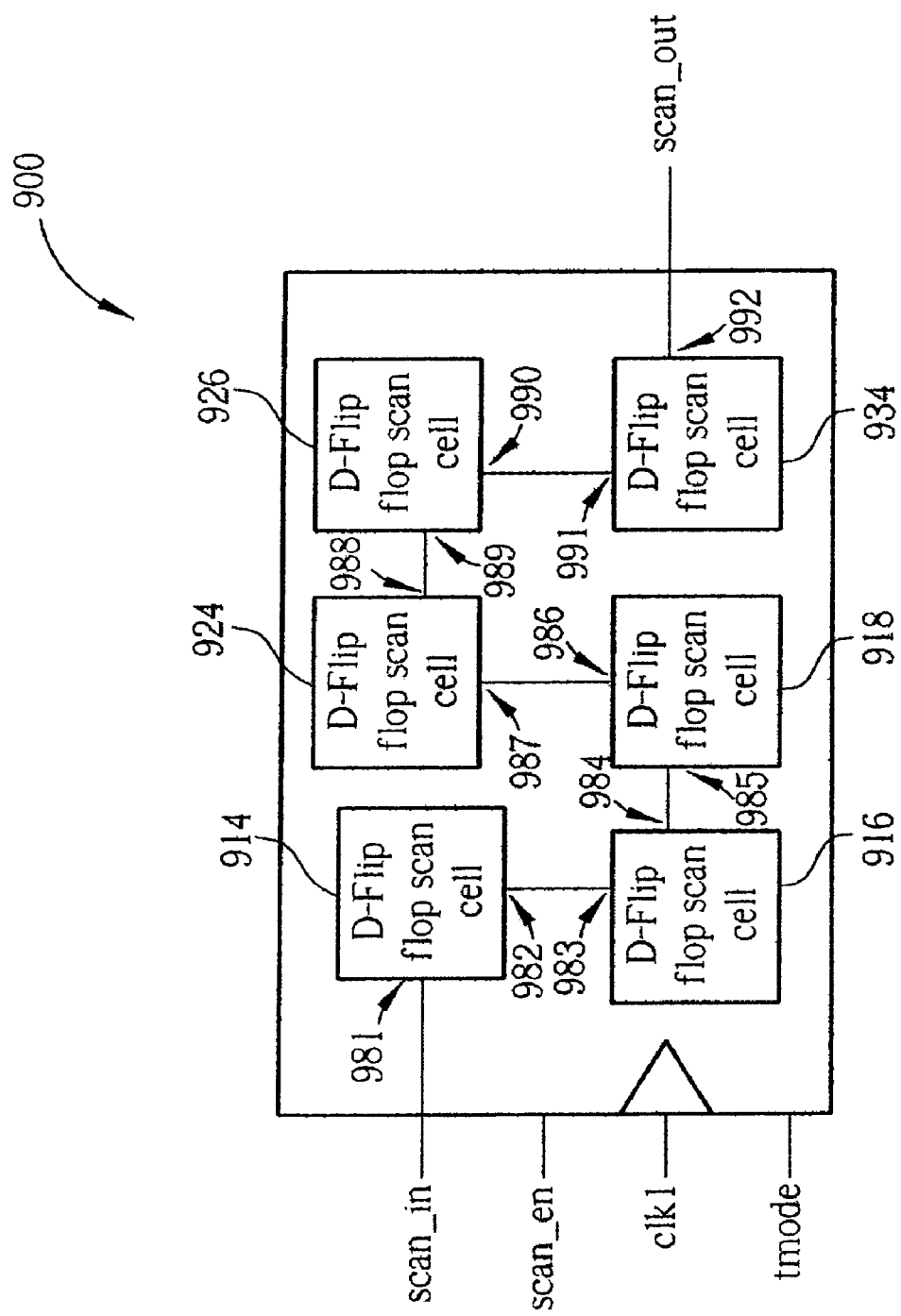
FIG. 9 is a scan chain diagram of the multiple clock domain logic system according to the present invention.

Please refer to FIG. 9 showing a scan chain diagram of the multiple clock domain logic system 900 according to the present invention. When scan tests are performed, the D-type flip flop scan cells 914, 916, 918, 924, 926, 934 in different clock domains are linked together to form at least one scan chain. The scan input end (SI) of the next D-type flip flop scan cell is electrically connected to the data output end (Q) of the previous D-type flip flop scan cell so that the output signal of the previous scan cell is the scan input signal of the next scan cell. Firstly the scan input signal scan_in is inputted through the D-type flip flop scan cell 914, into the first scan cell 914 of the scan chain. Accordingly, the scan input signal scan_in shifts along the scan cells of the scan chain. Therefore, the D-type flip flop scan cells 914, 916, 918, 924, 926, 934 receive logic values carried by the scan input signal scan_in respectively, and output a scan output signal scan_out carrying the scan cell calculation result namely the scan test result.

In contrast to the prior art, all the D-type flip flop scan cells of the multiple clock domain logic system 900 according to the present invention perform scan tests with the same clock signal, the first clock signal clk1, so that it is permissible firstly to adjust the number of scan chains according to the number of input ports and output ports of the scan test equipment and secondly to equalize the lengths of the scan chains to load the scan chains in parallel to solve the prior art problem of the idling status of the input ports and the output ports. As a result, the amount of the input ports and the output ports can be minimized so that the cost of scan test is reduced.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A logic system for performing scan tests with a single scan clock comprising:
    a first clock domain for performing logic operations and scan tests with a first clock signal, the first clock domain including at least one first-domain scan cell for buffering data; and
    a second clock domain for performing logic operations with a second clock signal and for performing scan tests with the first clock signal, the second clock domain including at least one second domain scan cell for buffering data.

2. The logic system of claim 1 wherein the first-domain scan cell comprising:
    a multiplexer for selectively outputting a function input signal or a scan input signal according to a scan enable signal; and
    a D-type flip flop coupled to the multiplexer for receiving and outputting the function input signal or the scan input signal according to the first clock signal.

3. The logic system of claim 1 wherein the second clock domain further comprises:
    a first multiplexer for selectively outputting the first clock signal or the second clock signal as a second clock domain driving signal according to a mode signal; wherein
    the second-domain scan cell comprising:
    a second multiplexer for selectively outputting a function input signal or a scan input signal according to a scan enable signal; and
    a D-type flip flop coupled to the multiplexer for receiving and outputting the function input signal or the scan input signal according to the second clock domain driving signal.

4. The logic system of claim 1 wherein when performing scan tests, the first clock domain and the second clock domain are linked to form a scan chain.

5. The logic system of claim 1 wherein the second-domain scan cell comprising:
    a first multiplexer for selectively outputting a function input signal or a scan input signal according to a scan enable signal;
    a second multiplexer for selectively outputting the first clock signal or the second clock signal according to a mode signal; and
    a D-type flip flop coupled to the first multiplexer and the second multiplexer for receiving and outputting the function input signal or the scan input signal according to the first clock signal or the second clock signal.

6. A method for performing scan tests of a logic system, the logic system comprising a multiple clock domain scan test circuit having a first clock domain and a second clock domain, the first clock domain including at least one first-domain scan cell, the second clock domain including at least one second-domain scan cell, the method comprising:
    when the logic system performs logic operations, performing logic operations according to a first clock signal and a second clock signal in the first clock domain and the second clock domain respectively; and
    when the logic system performs scan tests, performing scan tests according to a test clock signal in both the first clock domain and the second clock domain so that the first clock domain and the second clock domain demonstrate clock tree balance characteristic or clock tree quasi-balance characteristic.

7. The method of claim 6, wherein the test clock signal is the first clock signal.

8. A method for performing scan tests in a logic system, the logic system comprising a first clock domain and a second clock domain, the method comprising:
    providing a mode signal, the value of which indicates a first mode or a second mode;
        operating the first clock domain referencing to a first clock signal during the first mode;
        operating the second clock domain referencing to a second clock signal being of a frequency different from a frequency of the first clock signal during the first mode;
        operating the first clock domain referencing to the first clock signal to perform a scan test in the first clock domain during the second mode; and
        operating the second clock domain referencing to the first clock signal to perform the scan test in the second clock domain during the second mode.

9. The method of claim 8, wherein the logic system further comprising a third clock domain, the method further comprising:
    operating the third clock domain referencing to a third clock signal being of a frequency different from a frequency of the first clock signal or a frequency of the second clock signal during the first mode; and
    operating the third clock domain referencing to the first clock signal to perform the scan test in the third clock domain during the second mode.

10. The method of claim 8, further comprising:
    providing at least one first-domain scan cell in the first clock domain;
    providing at least one second domain scan cell in the second clock domain;
    clocking the first-domain scan cell with the first clock signal during the first mode;
    clocking the second domain scan cell with the second clock signal during the first mode;
    clocking the first-domain scan cell with the first clock signal during the second mode; and
    clocking the second-domain scan cell with the first clock signal during the second mode.

11. The method of claim 10, further comprising:
    achieving clock tree balance characteristic or clock tree quasi-balance characteristic among the at least one first-domain scan cell and the at least one second-domain scan cell.

12. The method of claim 8, further comprising:
    linking the first clock domain and the second clock domain to form a single scan chain during the second mode.

13. The method of claim 12, wherein the scan chain comprises the at least one first-domain scan cell and the at least one second-domain scan cell.

* * * * *